(12) United States Patent
Tseng

(10) Patent No.: US 8,912,542 B2
(45) Date of Patent: Dec. 16, 2014

(54) TFT STRUCTURE AND LCD DEVICE

(71) Applicant: Shenzhen China Star Optoelectronics Technology Co., Ltd., Shenzhen (CN)

(72) Inventor: Chihyuan Tseng, Shenzhen (CN)

( * ) Notice: Subject to any disclaimer, the term of this patent is extended or adjusted under 35 U.S.C. 154(b) by 0 days.

(21) Appl. No.: 13/824,341

(22) PCT Filed: Feb. 27, 2013

(86) PCT No.: PCT/CN2013/071914
§ 371 (c)(1),
(2), (4) Date: Mar. 15, 2013

(87) PCT Pub. No.: WO2014/114018
PCT Pub. Date: Jul. 31, 2014

(65) Prior Publication Data
US 2014/0203274 A1    Jul. 24, 2014

(30) Foreign Application Priority Data

Jan. 23, 2013  (CN) .......................... 2013 1 0024370

(51) Int. Cl.
*H01L 29/78* (2006.01)
*G02F 1/1368* (2006.01)
*H01L 29/66* (2006.01)
*H01L 29/786* (2006.01)

(52) U.S. Cl.
CPC ........ *G02F 1/1368* (2013.01); *H01L 29/66969* (2013.01); *H01L 29/78693* (2013.01)
USPC .......................................................... 257/59

(58) Field of Classification Search
CPC .............. H01L 27/124; H01L 27/1214; H01L 29/66969; H01L 29/7869
USPC ................... 257/43, 59, 72; 438/104
See application file for complete search history.

(56) References Cited

U.S. PATENT DOCUMENTS

| | | | | |
|---|---|---|---|---|
| 2009/0236600 | A1* | 9/2009 | Yamazaki et al. | 257/59 |
| 2010/0044708 | A1* | 2/2010 | Lin et al. | 257/59 |
| 2010/0289997 | A1* | 11/2010 | Suzuki | 349/158 |
| 2012/0298983 | A1* | 11/2012 | Chang et al. | 257/43 |
| 2014/0084292 | A1* | 3/2014 | Hung et al. | 257/59 |

FOREIGN PATENT DOCUMENTS

| | | |
|---|---|---|
| CN | 101540341 A | 9/2009 |
| CN | 101901787 A | 12/2010 |
| CN | 102655095 A | 9/2012 |
| CN | 102723310 A | 10/2012 |
| JP | 2009-49340 A | 3/2009 |
| WO | WO2011/151990 A1 | 12/2011 |

OTHER PUBLICATIONS

Liu Le, the International Searching Authority written comments, Oct. 2013, CN.

* cited by examiner

*Primary Examiner* — Nathan Ha

(57) ABSTRACT

A thin film transistor (TFT) structure includes a first metal layer. The first metal layer is configured with an insulating layer, a second metal layer covers a surface of the insulating layer, an area of the second metal layer that corresponds to an area above the first metal layer is configured with a gap. An area of the insulating layer that corresponds to the gap is configured with a groove. An active layer made of an indium gallium zinc oxide (IGZO) covers surfaces of the second metal layer, the gap, and the groove.

19 Claims, 3 Drawing Sheets

TFT STRUCTURE AND LCD DEVICE

TECHNICAL FIELD

The present disclosure relates to the field of liquid crystal displays (LCDs), and more particularly to a thin film transistor (TFT) structure, an LCD device, and a method for manufacturing the TFT.

BACKGROUND

Most typical liquid crystal display (LCD) panels use thin film transistors (TFTs) to control deflection of liquid crystal (LC) molecules. A traditional manufacturing process for the TFT includes: sequentially forming a gate electrode, a source electrode, and a drain electrode of the TFT on a glass substrate, and connecting the source electrode and the drain electrode by an active layer which is usually made of amorphous silicon. With development in technology, researchers are beginning to use an indium gallium zinc oxide (IGZO) as a material of the active layer to replace the N+/a-Si (as shown in FIG. 1). Compared with the amorphous silicon, the IGZO has advantages of reduced TFT sizes, integration of a simple external circuit into the panel to enable a mobile device to be light and thin, and two-thirds power reduction compared to before. The IGZO further has advantages of increased pixel aperture rate of the LCD panel, improved image quality, improved electron mobility rate to 20-30 times as before, and greatly reduced response time of the LCD.

However, in actual use, characteristic and efficiency of the TFT using the IGZO are not ideal. As shown in FIG. 2, a middle current slowly increases with voltage, and a current value of more than $10*10^{-6}$ A is obtained only when the voltage exceeds 10 V. Generally, the voltage of 10 V is defined as $I_{on}$ (current when connecting the TFT), and the voltage of −5 V is defined as $I_{off}$ (current when disconnecting the TFT), when $I_{on}/I_{off}$ is more than $10^{-6}$ A, the IGZO may be applied to the TFT device. However, in FIG. 2, because $I_{on}/I_{off}$ is less than $10^{-3}$ A, the characteristic efficiency of the typical IGZO TFT is not high.

SUMMARY

In view of the above-described problems, the aim of the present disclosure is to provide a thin film transistor (TFT) structure, a liquid crystal display (LCD) device, and a method for manufacturing the TFT capable of improving characteristic efficiency of the TFT made of an indium gallium zinc oxide (IGZO).

The aim of the present disclosure is achieved by the following technical scheme.

A TFT structure comprises a first metal layer, the first metal layer is configured with an insulating layer. A second metal layer covers a surface of the insulating layer. An area of the second metal layer that corresponds to an area above the first metal layer is configured with a gap. An area of the insulating layer that corresponds to the gap is configured with a groove. An active layer made of an indium gallium zinc oxide (IGZO) covers surfaces of the second metal layer, the gap, and the groove.

Furthermore, a shape of the groove is consistent with a shape of the gap. This is a specific structure of the active layer. Because the shape of the groove is consistent with the shape of the gap, a source electrode metal layer and a drain electrode metal layer is used as protection layers to directly etch the groove 31 at the gap in a manufacturing process without additionally manufacturing masks, which reduces manufacturing cost.

Furthermore, the gap is used as a boundary by the second metal layer, the second metal layer of a first end of the gap is a source electrode metal layer of the TFT, and the second metal layer of a second end of the gap is a drain electrode metal layer of the TFT. The active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area. This is special structures of the second metal layer and the active layer.

Furthermore, a depth of the groove is 0.1%-60% of a maximum thickness of the insulating layer. The depth of the groove is a distance between a top surface of the insulating layer and a bottom of the groove. This is a value range of the depth of the groove. As long as the value range exceeds 0.1%, most impure surface material of the active layer is removed, and adequate active layer is reserved, achieving excellent TFT characteristic.

Furthermore, the depth of the groove is 0.2%-50% of the maximum thickness of the insulating layer. This is a preferable value range of the depth of the groove. Within the value range, the impure surface material of the active layer is basically removed, and adequate active layer is reserved, achieving excellent TFT characteristic.

Furthermore, an alignment layer covers surfaces of the second metal layer and the active layer. The alignment layer initially fixes position of deflections of liquid crystal (LC) molecules.

Furthermore, a transparent electrode covers a surface of the alignment layer. The transparent electrode is electrically connected with the second metal layer of an end of the gap to control deflection angles of the LC molecules.

Furthermore, a shape of the groove is consistent with a shape of the gap. The gap is used as a boundary by the second metal layer, the second metal layer of a first end of the gap is a source electrode metal layer of the TFT, and the second metal layer of a second end of the gap is a drain electrode metal layer of the TFT. The active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area. A depth of the groove is 0.1%-60% of a maximum thickness of the insulating layer. An alignment layer covers surfaces of the second metal layer and the active layer. A transparent electrode covers a surface of the alignment layer corresponding to the drain electrode metal layer.

A liquid crystal display (LCD) device comprises the TFT structure of the present disclosure.

A method for manufacturing a TFT comprises:

A: sequentially forming a first metal layer, an insulating layer, and a second metal layer on a substrate.

B: etching a gap on a surface of the second metal layer, the gap used as a boundary by the second metal layer, the second metal layer of a first end of the gap is a source electrode metal layer of the TFT, and the second metal layer of a second end of the gap is a drain electrode metal layer of the TFT.

C: etching a groove on a surface of the insulating layer by using the source electrode metal layer and the drain electrode metal layer as protection layers.

D: applying an active layer made of an indium gallium zinc oxide (IGZO) to surfaces of the second metal layer, the gap, and the groove.

The inventor finds by research that a manufacturing process of a typical TFT made of the IGZO comprises: forming a second metal layer on the insulating layer by sputtering and the like, then etching the gap on the active layer by chemical etching and dividing the second metal layer into two parts, and forming the source electrode metal layer and the drain electrode metal layer of the TFT. When the second metal layer is formed on the active layer, the second metal layer is combined with IGZO material of a surface of the active layer, which makes material of the active layer be impure, and characteristic and efficiency of the TFT be poor. In the present disclosure, since further etching the surface of the active layer to form the groove at the active layer through the gap of the second metal layer, the impure surface material of the active layer is removed, purity of the material of the active layer is increased, and thus the characteristic efficiency of the TFT are improved.

DETAILED DESCRIPTION

A liquid crystal display (LCD) device comprises a thin film transistor (TFT) structure. The TFT structure comprises a first metal layer, where the first metal layer is configured with an insulating layer. A second metal layer covers a surface of the insulating layer. An area of the second metal layer that corresponds to an area above the first metal layer is configured with a gap. An area of the insulating layer that corresponds to the gap is configured with a groove. An active layer made of an indium gallium zinc oxide (IGZO) covers surfaces of the second metal layer, the gap, and the groove.

The inventor finds by research that a manufacturing process of a typical TFT made of the IGZO comprises: forming the second metal layer on the active layer made of the IGZO by sputtering and the like, etching the gap on the active layer by chemical etching and dividing the second metal layer into two parts, and forming a source electrode metal layer and a drain electrode metal layer of the TFT. When the second metal layer is formed on the active layer, the second metal layer is combined with IGZO material on the surface of the active layer, which makes material of the active layer be impure and characteristic efficiency of the TFT be poor. In the present disclosure, since further etching the surface of the active layer to form the groove at the active layer through the gap of the second metal layer, the impure surface material of the active layer is removed, purity of the material of the active layer is increased, and thus the characteristic efficiency of the TFT are improved.

The present disclosure is further described in detail in accordance with the figures and the examples.

Figure 1:
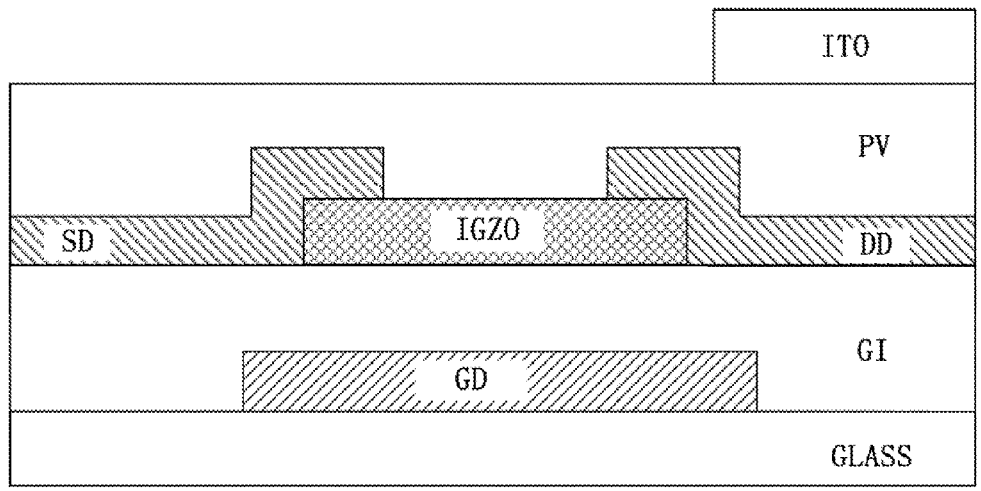
FIG. 1 is a structural diagram of a thin film transistor (TFT) made of an indium gallium zinc oxide (IGZO) of a prior art.
Figure 2:
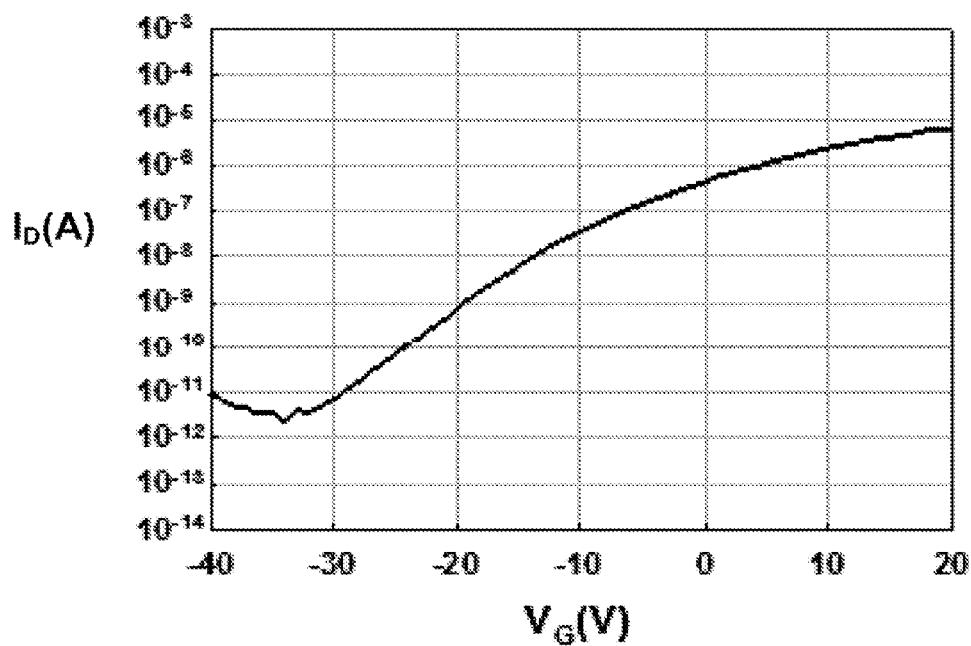
FIG. 2 is a curve diagram of a characteristic of the TFT made of the IGZO of FIG. 1.
Figure 3:
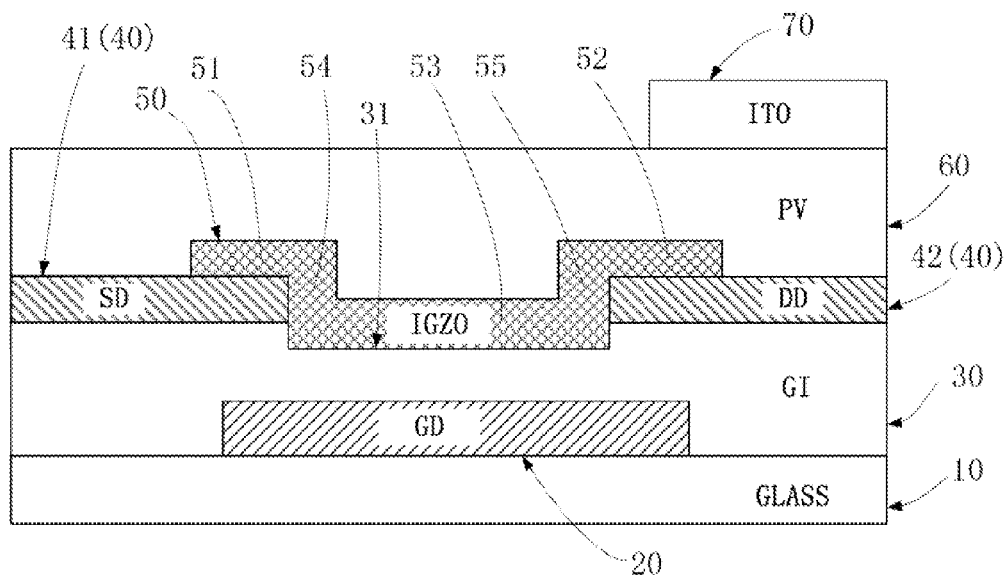
FIG. 3 is a structural diagram of a TFT of an example of the present disclosure.

As shown in FIG. 3, the TFT structure comprises a first metal layer 20 covering a transparent substrate 10 (glass substrate). The first metal layer 20 is configured with an insulating layer 30, and a second metal layer 40 covers a surface of the insulating layer 30. An area of the second metal layer 40 that corresponds to an area above the first metal layer 20 is configured with a gap. An area of the insulating layer 30 that corresponds to the gap is configured with a groove 31. An active layer 50 made of an indium gallium zinc oxide (IGZO) covers surfaces of the second metal layer 40, the gap, and the groove 31.

A shape of the groove 31 is consistent with a shape of the gap, the gap is used as a boundary by the second metal layer 40, the second metal layer of a first end of the gap is a source electrode metal layer 41 of the TFT, and the second metal layer of a second end of the gap is a drain electrode metal layer 42 of the TFT. The active layer 50 comprises a first area 51 in contact with the source electrode metal layer 41, a second area 52 in contact with the drain electrode metal layer 42, a third area 53 applied to the groove 31, a fourth area 54 applied at the first end of the gap of the second metal layer and connecting the first area 51 and the third area 53, and a fifth area 55 applied at the second end of the gap of the second metal layer and connecting the second area 52 and the third area 53. A depth of the groove 31 is 0.1%-60% of a maximum thickness of the insulating layer 30. Furthermore, the depth of the groove 31 is 0.2%-50% of the maximum thickness of the insulating layer 30. The depth of the groove 31 is a distance between a top surface of the insulating layer 30 and a bottom of the groove 31.

An alignment layer 60 covers the surface of the second metal layer 40 and a surface of the active layer 50. A transparent electrode 70 covers a surface of the alignment layer 60 corresponding to the drain electrode metal layer 42. The alignment layer 60 initially fixes position of deflections of liquid crystal (LC) molecules. The transparent electrode 70 is electrically connected with the second metal layer 40 of an end of the gap to control deflection angles of the liquid crystal (LC) molecules.

In the example, because the shape of the groove 31 is consistent with the shape of the gap, the source electrode metal layer and the drain electrode metal layer are used as protection layers to directly etch the groove 31 at the gap when manufacturing without additional use of manufacturing masks, which reduces manufacturing cost. The transparent substrate 10 of the present disclosure is made of the glass or other transparent materials. The etching method uses a typical mature technology, such as chemical etching or physical etching.

Figure 4:
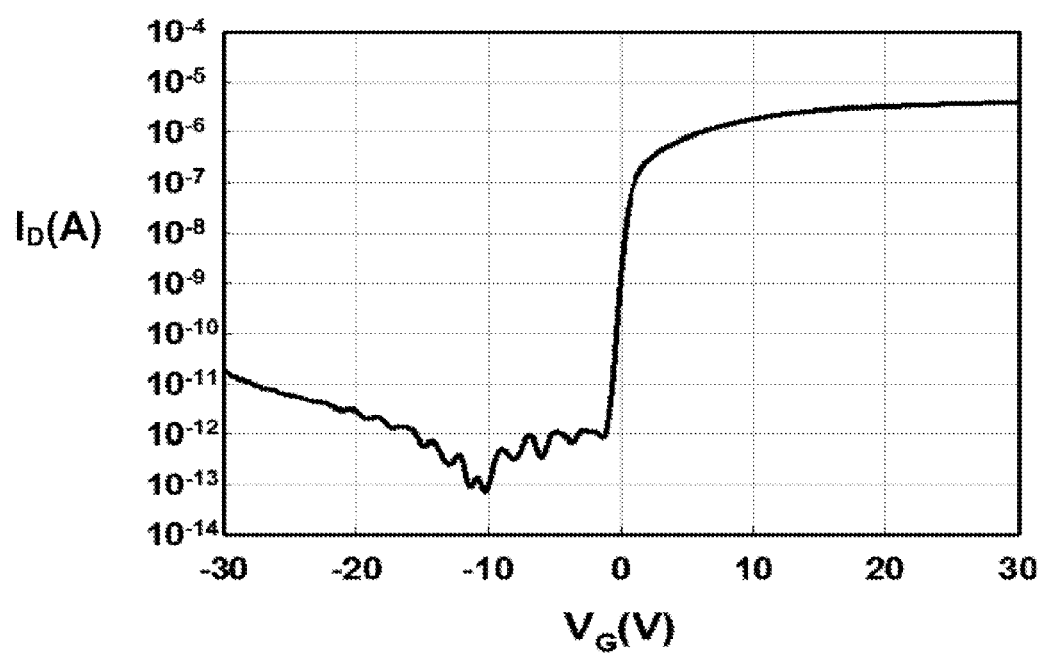
FIG. 4 is a curve diagram of a characteristic of the TFT of the FIG. 3.

FIG. 4 is a curve diagram of the characteristic of the TFT of the present disclosure in which the impure surface material of the insulating layer is removed. When a gate electrode voltage of the TFT is increased from 0 V to 10 V, current quickly rises with the gate electrode voltage, waveform slope of current is steep, and the TFT obtains high current within a short voltage range to drive the LCD. Thus, after the technical scheme of the present disclosure is performed, the characteristic efficiency of the TFT may be significantly improved.

Figure 5:
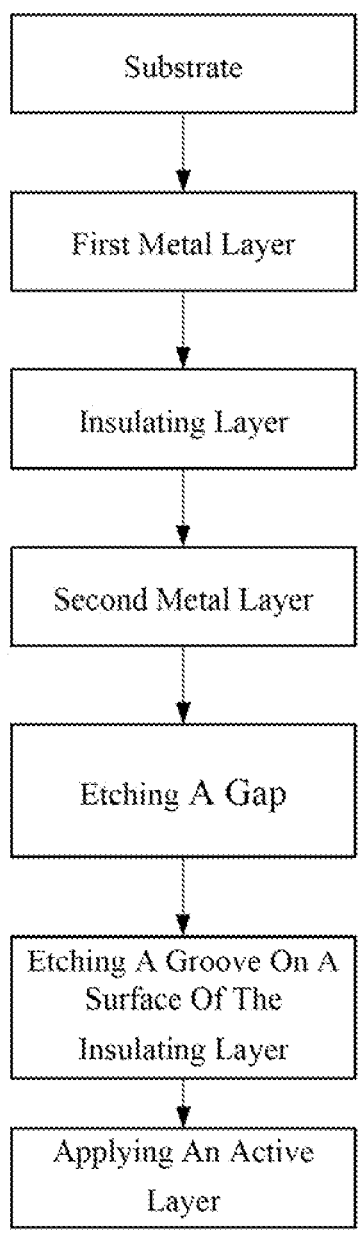
FIG. 5 is a schematic diagram of a method for manufacturing a TFT of an example of the present disclosure.

As shown in FIG. 5, the present disclosure further provides a method for manufacturing a TFT, comprising:

A: sequentially forming a first metal layer, an insulating layer, and a second metal layer on a transparent substrate such as a glass substrate.

B: etching a gap on a surface of the second metal layer, the gap used as a boundary by the second metal layer, the second metal layer of a first end of the gap is a source electrode metal layer of the TFT, and the second metal layer of a second end of the gap is a drain electrode metal layer of the TFT.

C: etching a groove on a surface of the insulating layer by using the source electrode metal layer and the drain electrode metal layer as protection layers.

D: applying an active layer made of an indium gallium zinc oxide (IGZO) to surfaces of the second metal layer, the gap, and the groove.

The present disclosure is described in detail in accordance with the above contents with the specific preferred examples. However, this present disclosure is not limited to the specific examples. For the ordinary technical personnel of the technical field of the present disclosure, on the premise of keeping the conception of the present disclosure, the technical personnel can also make simple deductions or replacements, and all of which should be considered to belong to the protection scope of the present disclosure.

I claim:

1. A thin film transistor (TFT) structure, comprising:
a first metal layer;
wherein the first metal layer is configured with an insulating layer, a second metal layer covers a surface of the insulating layer; an area of the second metal layer that corresponds to an area above the first metal layer is configured with a gap; wherein an area of the insulating layer that corresponds to the gap is configured with a groove;
wherein an active layer made of an indium gallium zinc oxide (IGZO) covers surfaces of the second metal layer, the gap, and the groove.

2. The TFT structure of claim 1, wherein an alignment layer covers surfaces of the second metal layer and the active layer.

3. The TFT structure of claim 2, wherein a transparent electrode covers a surface of the alignment layer.

4. The TFT structure of claim 1, wherein a shape of the groove is consistent with a shape of the gap.

5. The TFT structure of claim 4, wherein the gap is used as a boundary by the second metal layer, the second metal layer of a first end of the gap is a source electrode metal layer of the TFT, and the second metal layer of a second end of the gap is a drain electrode metal layer of the TFT;
wherein the active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area.

6. The TFT structure of claim 5, wherein an alignment layer covers surfaces of the second metal layer and the active layer.

7. The TFT structure of claim 6, wherein a transparent electrode covers a surface of the alignment layer.

8. The TFT structure of claim 4, wherein a depth of the groove is 0.1%-60% of a maximum thickness of the insulating layer.

9. The TFT structure of claim 8, wherein the depth of the groove is 0.2%-50% of the maximum thickness of the insulating layer.

10. The TFT structure of claim 1, wherein a shape of the groove is consistent with a shape of the gap; the gap is used as a boundary by the second metal layer, the second metal layer of a first end of the gap is a source electrode metal layer of the TFT, and the second metal layer of a second end of the gap is a drain electrode metal layer of the TFT;
wherein the active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area;
wherein a depth of the groove is 0.1%-60% of a maximum thickness of the insulating layer; an alignment layer covers surfaces of the second metal layer and the active layer; a transparent electrode covers a surface of the alignment layer corresponding to the drain electrode metal layer.

11. A liquid crystal display (LCD) device, comprising:
a thin film transistor (TFT) structure;
wherein the TFT structure comprises a first metal layer, the first metal layer is configured with an insulating layer;
wherein a second metal layer covers a surface of the insulating layer; an area of the second metal layer that corresponds to an area above the first metal layer is configured with a gap; wherein an area of the insulating layer that corresponds to the gap is configured with a groove;
wherein an active layer made of an indium gallium zinc oxide (IGZO) covers surfaces of the second metal layer, the gap, and the groove.

12. The LCD device of claim 11, wherein a shape of the groove is consistent with a shape of the gap.

13. The LCD device of claim 12, wherein the gap is used as a boundary by the second metal layer, the second metal layer of a first end of the gap is a source electrode metal layer of the TFT, and the second metal layer of a second end of the gap is a drain electrode metal layer of the TFT;
wherein the active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area.

14. The LCD device of claim 12, wherein an alignment layer covers surfaces of the second metal layer and the active layer.

15. The LCD device of claim 14, wherein a transparent electrode covers a surface of the alignment layer.

16. The LCD device of claim 12, wherein a depth of the groove is 0.1%-60% of a maximum thickness of the insulating layer.

17. The liquid crystal display (LCD) device of claim 16, wherein the depth of the groove is 0.2%-50% of the maximum thickness of the insulating layer.

18. The LCD device of claim 11, wherein a shape of the groove is consistent with a shape of the gap; the gap is used as a boundary by the second metal layer, the second metal layer of a first end of the gap is a source electrode metal layer of the TFT, and the second metal layer of a second end of the gap is a drain electrode metal layer of the TFT;
wherein the active layer comprises a first area in contact with the source electrode metal layer, a second area in contact with the drain electrode metal layer, a third area applied to the groove, a fourth area applied at the first end of the gap of the second metal layer and connecting the first area and the third area, and a fifth area applied at the second end of the gap of the second metal layer and connecting the second area and the third area;

wherein a depth of the groove is 0.1%-60% of a maximum thickness of the insulating layer; an alignment layer covers surfaces of the second metal layer and the active layer; a transparent electrode covers a surface of the alignment layer corresponding to the drain electrode metal layer.

19. A method for manufacturing a thin film transistor (TFT), comprising:
- A: sequentially forming a first metal layer, an insulating layer, and a second metal layer on a substrate;
- B: etching a gap on a surface of the second metal layer, the gap used as a boundary by the second metal layer, the second metal layer of a first end of the gap is a source electrode metal layer of the TFT, and the second metal layer of a second end of the gap is a drain electrode metal layer of the TFT;
- C: etching a groove on a surface of the insulating layer by using the source electrode metal layer and the drain electrode metal layer as protection layer;
- D: applying an active layer made of an indium gallium zinc oxide (IGZO) to surfaces of the second metal layer, the gap, and the groove.

* * * * *